(12) United States Patent
Yonekawa

(10) Patent No.: US 7,193,682 B2
(45) Date of Patent: Mar. 20, 2007

(54) EXPOSURE APPARATUS AND DEVICE MANUFACTURING METHOD

(75) Inventor: Masami Yonekawa, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 140 days.

(21) Appl. No.: 11/019,112

(22) Filed: Dec. 22, 2004

(65) Prior Publication Data

US 2005/0183823 A1 Aug. 25, 2005

(30) Foreign Application Priority Data

Dec. 26, 2003 (JP) ............................. 2003-434539

(51) Int. Cl.
*G03B 27/42* (2006.01)

(52) U.S. Cl. ...................... 355/53; 414/221; 250/492.2

(58) Field of Classification Search ...................... None
See application file for complete search history.

(56) References Cited

U.S. PATENT DOCUMENTS

| | | | | |
|---|---|---|---|---|
| 5,223,113 A | * | 6/1993 | Kaneko et al. | 204/298.33 |
| 5,914,493 A | * | 6/1999 | Morita et al. | 250/492.2 |
| 6,071,350 A | * | 6/2000 | Jeon et al. | 118/719 |
| 6,107,212 A | * | 8/2000 | Fujita | 438/758 |
| 6,388,263 B1 | * | 5/2002 | Song | 250/492.21 |
| 6,468,918 B1 | * | 10/2002 | Kuo | 438/715 |
| 2005/0118002 A1 | * | 6/2005 | Kasumi | 414/221 |
| 2005/0277031 A1 | * | 12/2005 | Yan | 430/5 |

FOREIGN PATENT DOCUMENTS

| JP | 2003-234282 | | 8/2003 |
|---|---|---|---|
| JP | 2003229348 | * | 8/2003 |

* cited by examiner

*Primary Examiner*—D. Rutledge
(74) *Attorney, Agent, or Firm*—Fitzpatrick, Cella, Harper & Scinto

(57) ABSTRACT

An exposure apparatus for exposing a substrate. The apparatus includes an optical system being set at a reference temperature, for directing light to the substrate, an exposure chamber for storing the optical system in a vacuum ambience, and a load-lock chamber, disposed adjacent to the exposure chamber, for converting an ambience of a space surrounding the substrate into a vacuum ambience. When the load-lock chamber converts the ambience of the space surrounding the substrate into a vacuum ambience, the temperature of the load-lock chamber is made higher than the reference temperature.

14 Claims, 16 Drawing Sheets

EXPOSURE APPARATUS AND DEVICE MANUFACTURING METHOD

FIELD OF THE INVENTION AND RELATED ART

This invention relates generally to a semiconductor exposure apparatus. More particularly, the invention concerns an exposure apparatus having a load-lock chamber, which is provided in association with an apparatus for exposing a semiconductor substrate in a vacuum ambience.

In relation to semiconductor devices, such as DRAMs or MPUs, for example, much research and many developments are currently being done to achieve devices having a linewidth of 0.11 µm or less in design rule. The exposure apparatuses to be used for this generation will be those using an electron beam (EB) or extreme ultraviolet light (EUV).

In such EB or EUV exposure apparatuses, exposure in atmosphere is impracticable. The exposure has to be done in a vacuum and, hence, the wafer loading and unloading should be made by way of a load-lock chamber.

Generally, the load-lock chamber functions so that it receives a wafer under atmospheric pressure and then, the chamber is vacuum exhausted to a predetermined pressure level. After that, a door is opened, and the wafer is loaded into the exposure apparatus. After the exposure is completed, the wafer is unloaded from the exposure apparatus, and the door at the exposure side is closed. After that, the chamber inside pressure is turned back to the atmospheric pressure, and then, the wafer is unloaded from the chamber.

Here, when the load-lock chamber is vacuum exhausted, particles are created within the chamber and they are adhered to and deposited on the wafer surface. This causes a serious decrease of yield of device production and degradation of device reliability.

Conventionally, the mechanism of this phenomenon has been regarded as particles, which are adhered and deposited inside the load-lock chamber, are raised by vacuum exhausting, and they are adhered to the wafer. Recently, however, another finding has been obtained, according to which water vapor contained in the load-lock chamber is condensed by a rapid temperature decrease due to adiabatic expansion of inside gas, and the vapor is adhered to the wafer.

The temperature of the gas during the vacuum evacuation largely depends on the type of gas, the capacity of the load-lock chamber, exhaust speed, and so on. A decrease amount of a few tens of degrees (° C.) was observed. When water vapor is contained in the load-lock chamber, due to a rapid decrease of the gas temperature, taking small particles as a nucleus, the water vapor is condensed and grows into large particles (heterogeneous nucleation condensation). Depending on the temperature, vapor is frozen into ice, which is deposited on the wafer. Furthermore, the above-described phenomenon of water vapor condensation causes serious problems even without the presence of particles inside the load-lock chamber that function as nuclei, the problems being that various ions inside the gas function as a condensation nucleus (heterogeneous nucleation condensation), or that water vapor is coagulated and grows largely (homogeneous nuleation). Thus, the presence of water vapor inside the load-lock chamber, itself, is the source of the problem.

Japanese Laid-Open Patent Application, Publication No. 2003-234282 proposes the use of a heater inside a load-lock chamber, as well as adjusting the exhausting speed for exhausting the gas inside the load-lock chamber, in an attempt to avoid condensation of water vapor inside the load-lock chamber.

SUMMARY OF THE INVENTION

It is accordingly an object of the present invention to provide a unique and an improved exposure apparatus by which at least one of the inconveniences described above can be solved or reduced.

In accordance with an aspect of the present invention, to achieve the above object, there is provided an exposure apparatus for exposing a substrate, comprising an optical system being set at a reference temperature, for directing light to the substrate, an exposure chamber for storing the optical system in a vacuum ambience, and a load-lock chamber disposed adjacent to the exposure chamber, for converting an ambience of a space surrounding the substrate into a vacuum ambience, wherein, when the load-lock chamber converts the ambience of the space surrounding the substrate into a vacuum ambience, the temperature of the load-lock chamber is made higher than the reference temperature.

In one preferred form of this aspect of the present invention, the difference between the load-lock chamber temperature and the reference temperature is not less than five degrees and not greater than thirty degrees. Preferably, the difference between the load-lock chamber temperature and the reference temperature is not less than ten degrees. More preferably, the difference between the load-lock chamber temperature and the reference temperature is not greater than twenty degrees.

The apparatus may further comprise a heating mechanism for applying heat to the load-lock chamber, wherein the heating mechanism is provided in a space, inside the load-lock chamber, that does not contact with the space surrounding the substrate.

The temperature of the load-lock chamber may be a temperature with which water vapor inside the space surrounding the substrate is not condensed during exhausting of a gas inside the space surrounding the substrate.

The load-lock chamber may function to start the conversion of the ambience of the space surrounding the substrate inside the load-lock chamber either when a result of measurement of gas temperature measuring means provided in relation to the load-lock chamber shows a temperature equal to or higher than a predetermined temperature or when the time in which a gas inside the load-lock chamber receives heat supply from a wall of the load-lock chamber becomes equal to or longer than a predetermined time period.

The apparatus may further comprise at least one of a heat insulating material or a heat insulating structure provided between the load-lock chamber and the exposure chamber.

The apparatus may further comprise gas supply means for supplying a gas into the load-lock chamber, and gas temperature adjusting means capable of raising the temperature of the gas supplied by the gas supplying means up to or beyond a predetermined temperature.

The apparatus may further comprise temperature measuring means for measuring the temperature of the load-lock chamber, and control means for controlling the temperature of the load-lock chamber on the basis of the measured temperature of the load-lock chamber.

The apparatus may further comprise heating means for applying heat to the load-lock chamber.

The apparatus may further comprise a deformable member provided between the exposure chamber and the load-lock chamber for relative displacement. The deformable member may be a bellows.

In accordance with another aspect of the present invention, there is provided an exposure apparatus for exposing a substrate, comprising an optical system being set at a reference temperature, for directing light to the substrate, an exposure chamber for storing the optical system in a vacuum ambience, a load-lock chamber disposed adjacent to the exposure chamber, for converting an ambience of a space surrounding the substrate into a vacuum ambience, and at least one of a heat insulating material and a heat insulating structure provided between the load-lock chamber and the exposure chamber.

The apparatus may further comprise heating means for applying heat to the load-lock chamber.

In one preferred form of this aspect of the present invention, the time in which the substrate is introduced into the load-lock chamber and the time in which the heating means applies heat to the load-lock chamber are at least partially overlapped with each other.

In accordance with a further aspect of the present invention, there is provided a device manufacturing method, comprising the steps of exposing a substrate by use of an exposure apparatus as discussed above, and developing the exposed substrate.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

Embodiment 1

First of all, a projection exposure apparatus to which the present invention is applied will be explained, with reference to an EUV exposure apparatus shown in FIG. 2 of the drawings.

Figure 2:
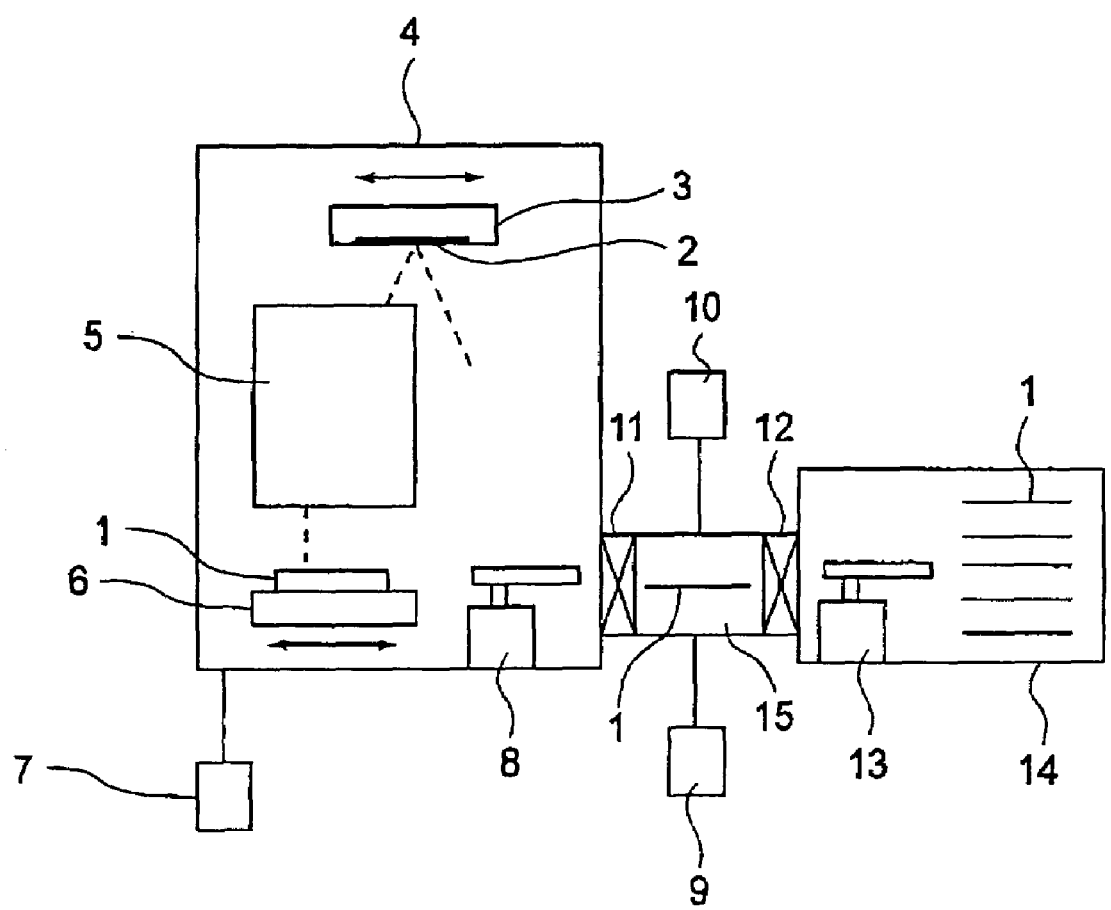
FIG. 2 is a schematic view of an exposure system to which the present invention is applied.

In FIG. 2, denoted at 1 is a wafer, and denoted at 2 is a reflection type mask having an electronic circuit pattern formed thereon. Denoted at 3 is a mask stage for holding a reflection type mask thereon and for coarsely and finely moving the same in a scan direction, and denoted at 5 is an optical system for directing reflection light from the mask to a wafer 1 for projection exposure thereof. Denoted at 6 is a wafer stage for holding a wafer thereon and for coarsely and finely moving the same in six-axis directions. The position of the wafer stage with respect to the X- and Y-axis directions is continuously monitored by means of laser interferometers (not shown). Normally, the scan motion of the mask stage 3 and the wafer stage 6 is synchronously controlled to assure that, when the reduction magnification of the projection optical system is $1/\beta$, the san speed of the mask stage is Vr, and the scan speed of the wafer stage is Vw, a relation $Vr/Vw=\beta$ is satisfied, between the scan speeds of these stages. Denoted at 8 is a conveyance hand for loading and unloading a wafer between the wafer stage 6 and a load-lock chamber to be described later.

The exposure process is carried out in an approximately vacuum ambience (high vacuum ambience to substantially avoid degradation of transmittance of EB light or EUV light), and, for this reason, these units are accommodated in an apparatus chamber 4. Denoted at 7 is a vacuum pump for performing vacuum evacuation of the chamber 4. Denoted at 15 is roughly illustrated load-lock chamber of the present invention, and denoted at 9 is a vacuum pump for performing vacuum evacuation of the load-lock chamber 15. Denoted at 10 is a vent gas supply source for supplying dry $N_2$ or dry air, for example, when the vacuum level inside the load-lock chamber should be turned back to the atmospheric pressure. Denoted at 11 is an apparatus-side gate valve for partitioning between the apparatus chamber and the load-lock chamber, and denoted at 12 is an exchanging-chamber side gate valve for partitioning between the load-lock chamber and a substrate exchanging-chamber side gate valve for partitioning between the load-lock chamber and a substrate exchanging chamber, to be described later. Denoted at 14 is the substrate exchanging chamber for temporarily storing a wafer under an atmospheric pressure. Denoted at 13 is a conveying hand for loading and unloading a wafer between the load-lock chamber and the substrate exchanging chamber. Although an illumination optical system for illuminating a reflection type mask 2 with the use of light from a light source is not illustrated, such an illumination optical system is included in the EUV exposure apparatus of this embodiment, as a matter of course.

Details of the load-lock chamber of the present invention will now be described.

As regards the sequence of wafer conveyance, first, a wafer in the wafer exchanging chamber 14 is loaded into the load-lock chamber 15 under atmospheric pressure, by means of the conveyance hand 13. The gate valve 12 is then closed and, after that, a valve of the vacuum exhaust system 9 is opened, whereby exhausting is started. After tens of seconds and a predetermined pressure is reached, the gate valve 11 is opened and, by means of the conveying hand 8, the wafer is conveyed from the load-lock chamber 15 to the wafer stage 6. After alignment thereof is accomplished, the exposure process is initiated.

Figure 3:
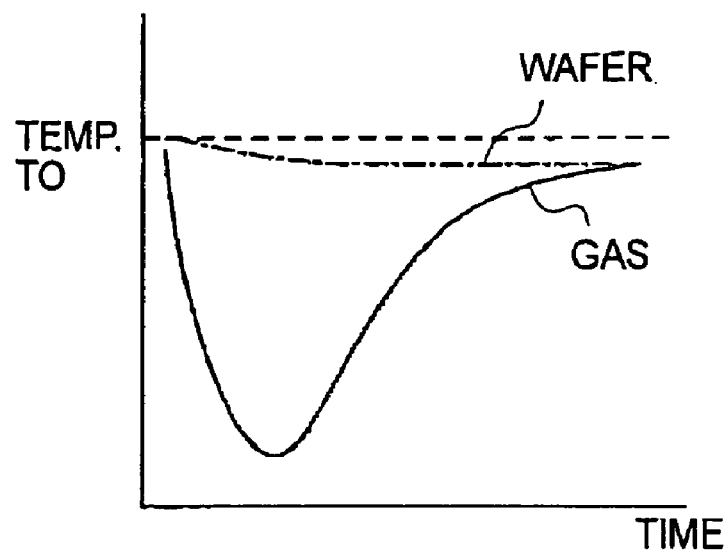
FIG. 3 is a graph for explaining temperature decreases of a gas and a wafer inside a load-lock chamber during vacuum evacuation.

During the process of vacuum exhausting of the load-locking, inside gases are rapidly cooled due to adiabatic expansion. FIG. 3 illustrates this temperature of the gas and the wafer after the gate valve 12 is closed and at the moment when the vacuum evacuation is just going to be initiated, is T0. As the vacuum exhausting starts, the temperature of the gas rapidly decreases and, while it depends on the chamber capacity and the exhausting speed, for example, after tens of seconds later, the temperature is lowered by tens of degrees from T0. After that, due to heat conduction from the chamber wall that has a large heat capacity, the temperature rapidly becomes close to T0. On the other hand, as regards the wafer having a large heat capacity as compared with the gas, the temperature decreases with a longer time constant as compared with the gas. It takes more than thirty minutes until, after a temperature decrease by a few degrees, the temperature returns close to T0.

As described hereinbefore, rapid cooling of the gas causes the inconveniences that water vapor inevitably mixed into the gas reach dew point and is condensed. Depending on the temperature, vapor is frozen into ice, which is then adhered to and deposited on a wafer as particles.

In accordance with this embodiment, to avoid the inconveniences caused by a rapid temperature decrease of the gas, heating means is provided at the load-lock chamber wall so as to keep the load-lock chamber wall continuously at a predetermined temperature or higher, such that the inside gas of the load-lock chamber can be heated by the thermal energy from the load-lock chamber wall. After the gas inside the load-lock chamber is raised to a predetermined temperature or more, vacuum evacuation of the load-lock chamber is initiated. This means that, by heating the inside gas beforehand, the relative humidity is lowered, and also that, by heating the chamber wall, the amount of heat supply from the wall to the gas is increased to thereby prevent the water vapor inside the load-lock chamber from reaching the dew point.

Figure 1:
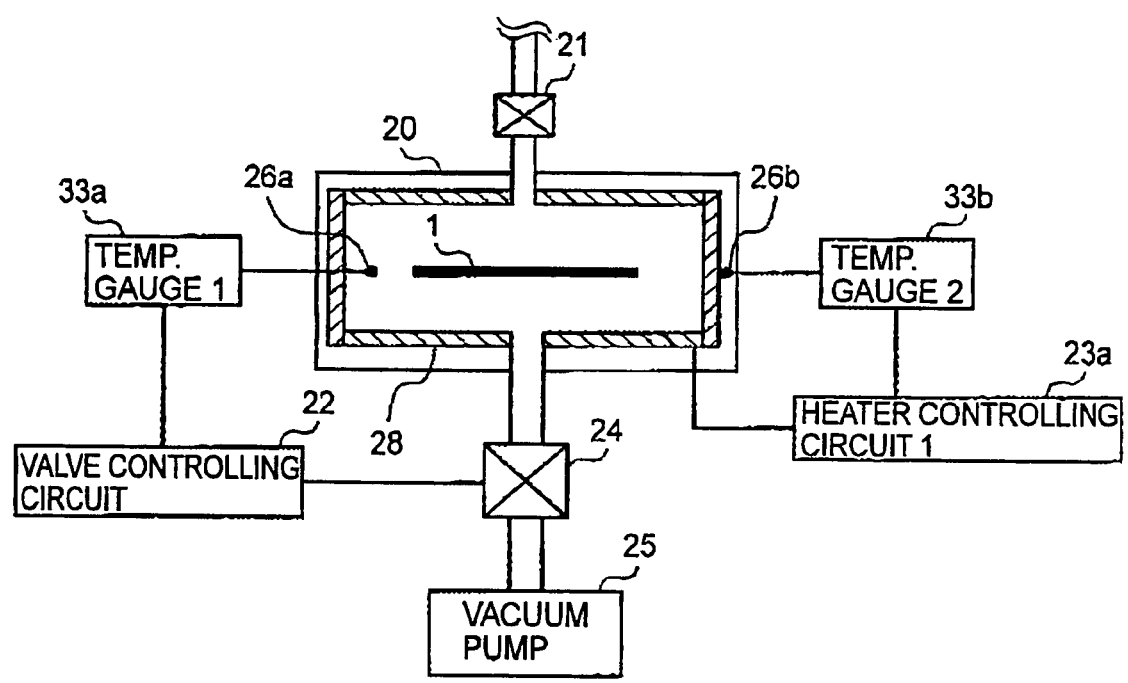
FIG. 1 is a schematic and diagrammatic view for explaining a first embodiment of the present invention.

Referring to FIG. 1, the load-lock chamber of the present invention will be explained in more detail. Denoted in the drawing at 20 is a load-lock chamber. Gate valves, which are opened and closed for wafer loading and unloading, are not illustrated. Denoted at 1 is a wafer. Denoted at 28 is a flat heater for heating the gas and the chamber wall up to a predetermined temperature. In this embodiment, the flat heater is put on the whole inside wall surface. The flat heater 28 has a function of raising the chamber wall temperature at a predetermined temperature or higher and it keeps the temperature. The chamber wall thus heated can serve to heat a vent gas, each time it is supplied for the venting, up to a predetermined temperature or more.

Denoted at 24 is an exhaust valve provided in a portion of an exhaust pipe system, and denoted at 25 is a vacuum pump. Denoted at 21 is a valve, which is used when dry nitrogen or dry air, for example, is to be vented into the chamber. Denoted at 26a and 26b are temperature sensors for measuring the inside gas temperature and the chamber temperature, and denoted at 33a and 33b are temperature gauges for these sensors. Denoted at 23a is a heater control circuit having a function for heating the chamber wall up to or more than a predetermined temperature and also for maintaining that temperature. Denoted at 22 is a valve control circuit by which the exhaust valve 24 is opened when the gas heated by the chamber wall reaches a desired temperature or higher, to initiate the vacuum evacuation.

As regards the predetermined temperature for which the inside gas and the chamber should be heated, the gas and the wall may be heated up to a temperature with which condensation of water vapor contained in the inside gas during vacuum exhaust is substantially prevented. With respect to the relationship between the temperature and the water vapor condensation, the inventor of the subject application conducted simulations. Referring now to FIGS. 4–12, the results of these simulations will be explained.

Figure 4:
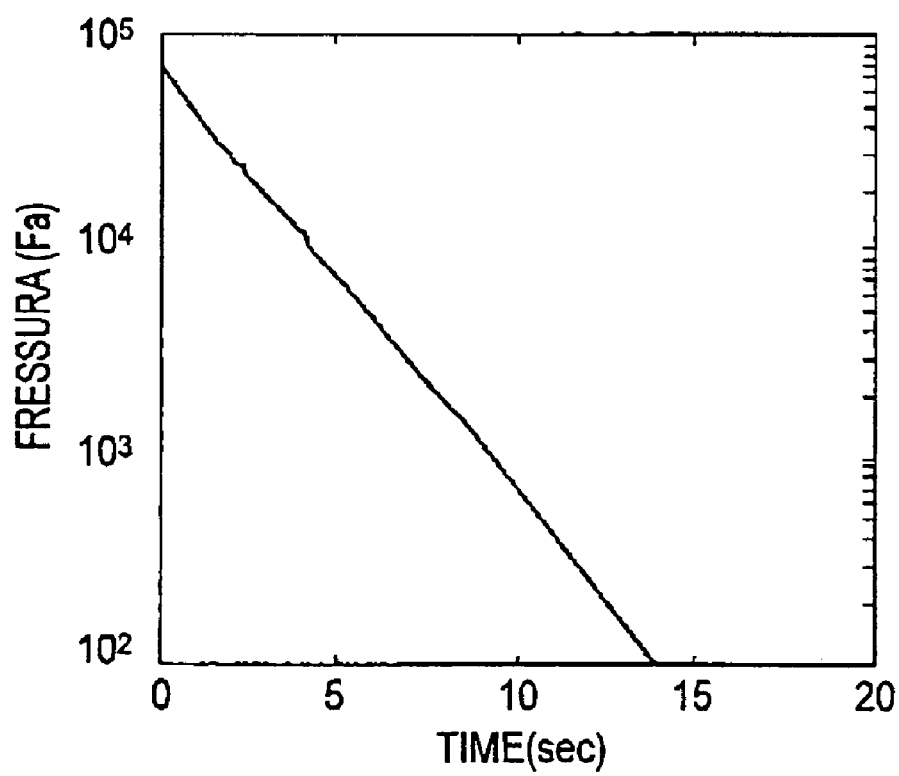
FIG. 4 is a graph for explaining the chamber inside pressure during vacuum evacuation in a first state, in the first embodiment of the present invention.
Figure 5:
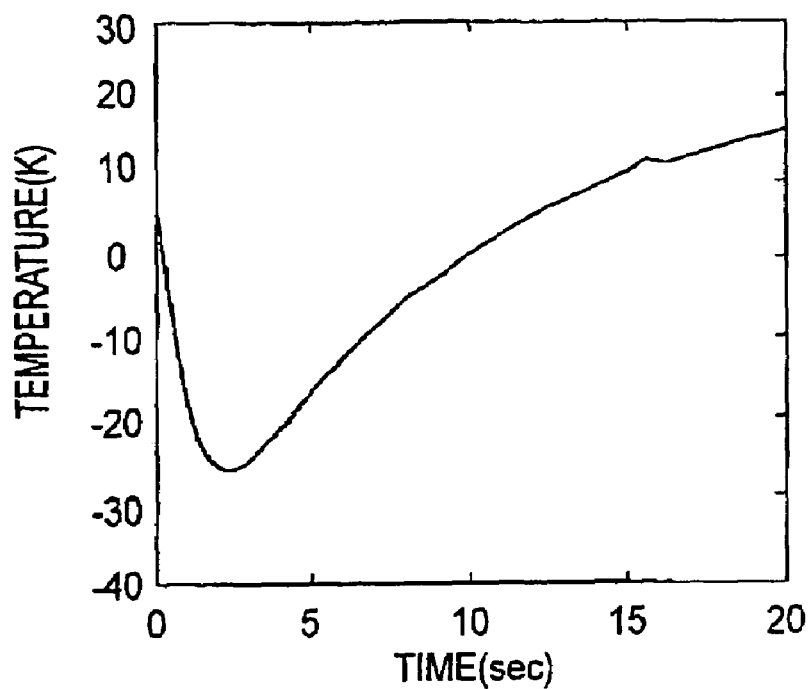
FIG. 5 is a graph for explaining the gas temperature during vacuum evacuation in the first state, in the first embodiment of the present invention.
Figure 6:
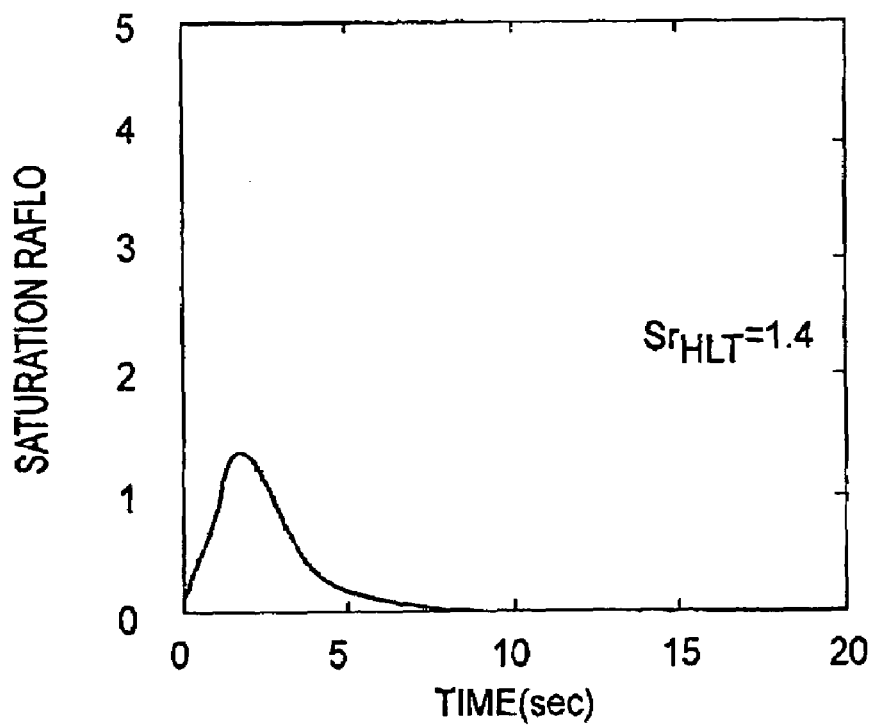
FIG. 6 is a graph for explaining the value of the saturation degree Sr during vacuum evacuation in the first state, in the first embodiment of the present invention.

Among these drawings, FIGS. 4, 5 and 6 concern a case wherein both the gas temperature inside the load-lock chamber and the temperature of the load-lock chamber wall, before a start of vacuum evacuation, are set at an apparatus reference temperature of 23° C. Hereinafter, this state will be referred to as a "first state". On the other hand, FIGS. 7, 8 and 9 concern a case wherein only the gas temperature inside the load-lock chamber is set at a temperature of 23° C.+10° C. Hereinafter, this state will be referred to as a "second state". Further, FIGS. 10, 11 and 12 concern a case wherein both the gas temperature inside the load-lock chamber and the temperature of the load-lock chamber wall are set at a temperature of 23° C.+10° C. Hereinafter, this state will be referred to as a "third state".

Although it is desirable that the exposure apparatus as a whole is at the reference temperature, particularly, the optical system (illumination optical system and the projection optical system), should be maintained at the reference temperature or in a range of ±1 degree with respect to the reference temperature, more preferably, in a range of ±0.5 degree with respect to the reference temperature. Of course, any other structural components other than the optical systems should desirably be maintained at the reference temperature or in an allowable tolerance range of the reference temperature.

Figure 7:
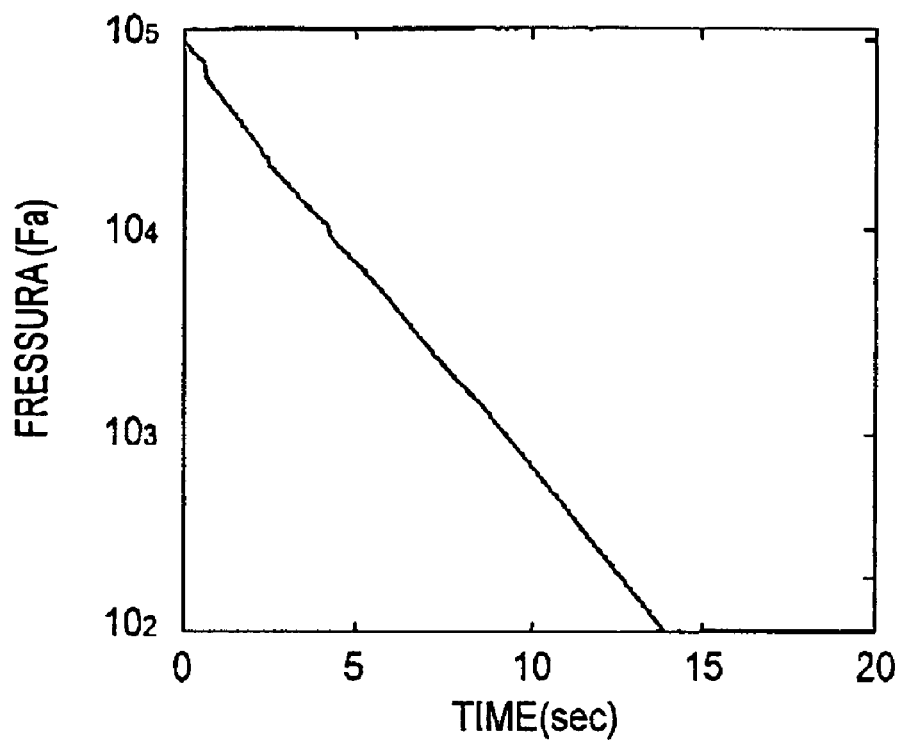
FIG. 7 is a graph for explaining the chamber inside pressure during vacuum evacuation in a second state, in the first embodiment of the present invention.
Figure 8:
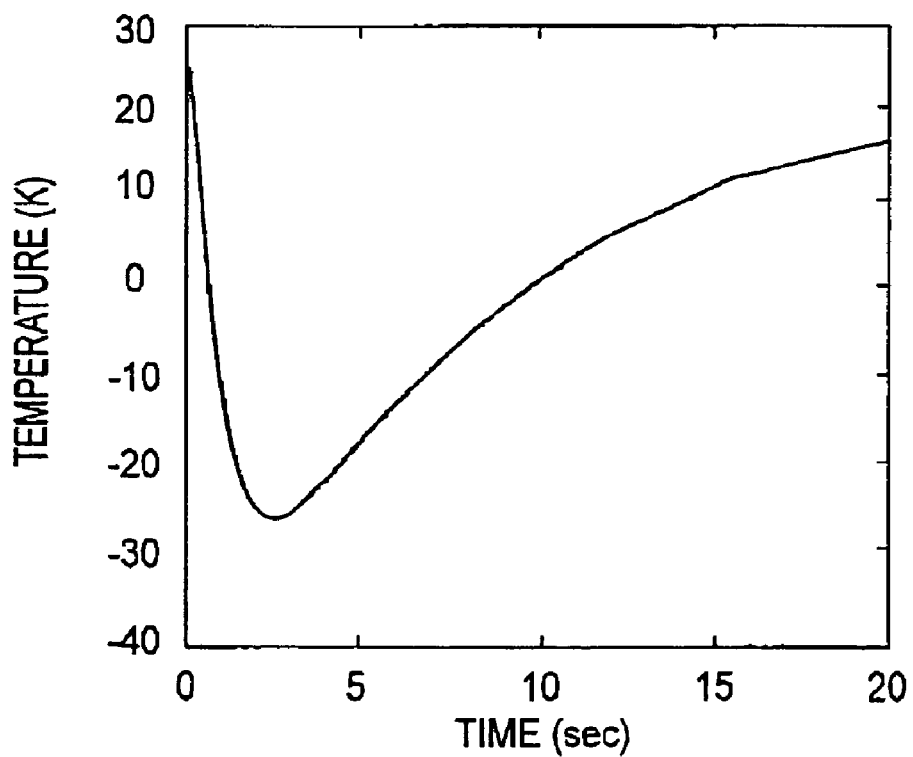
FIG. 8 is a graph for explaining the gas temperature during vacuum evacuation in the second state, in the first embodiment of the present invention.
Figure 9:
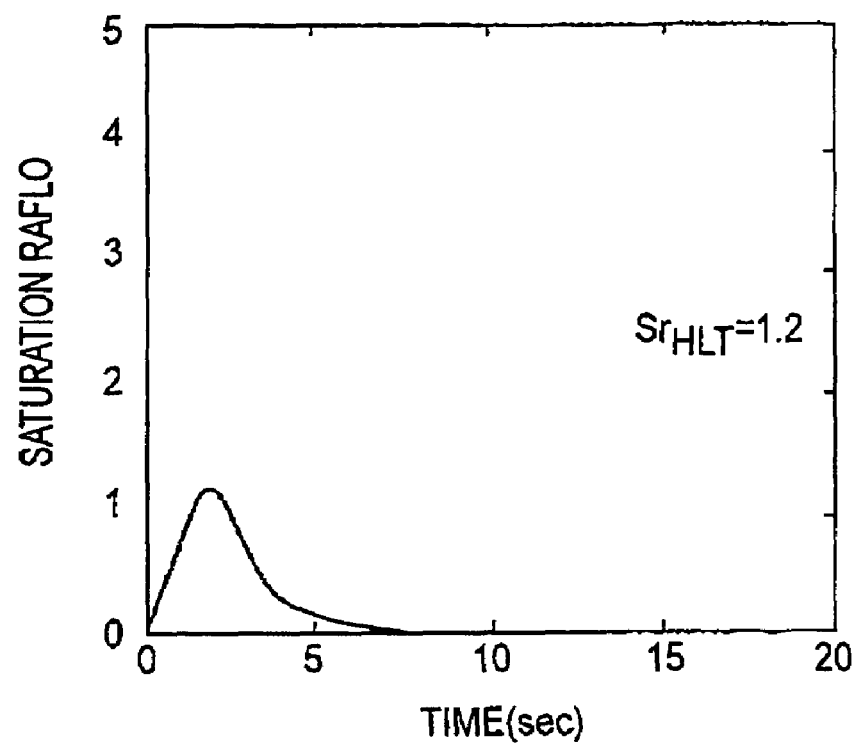
FIG. 9 is a graph for explaining the value Sr during vacuum evacuation in the second state, in the first embodiment of the present invention.
Figure 10:
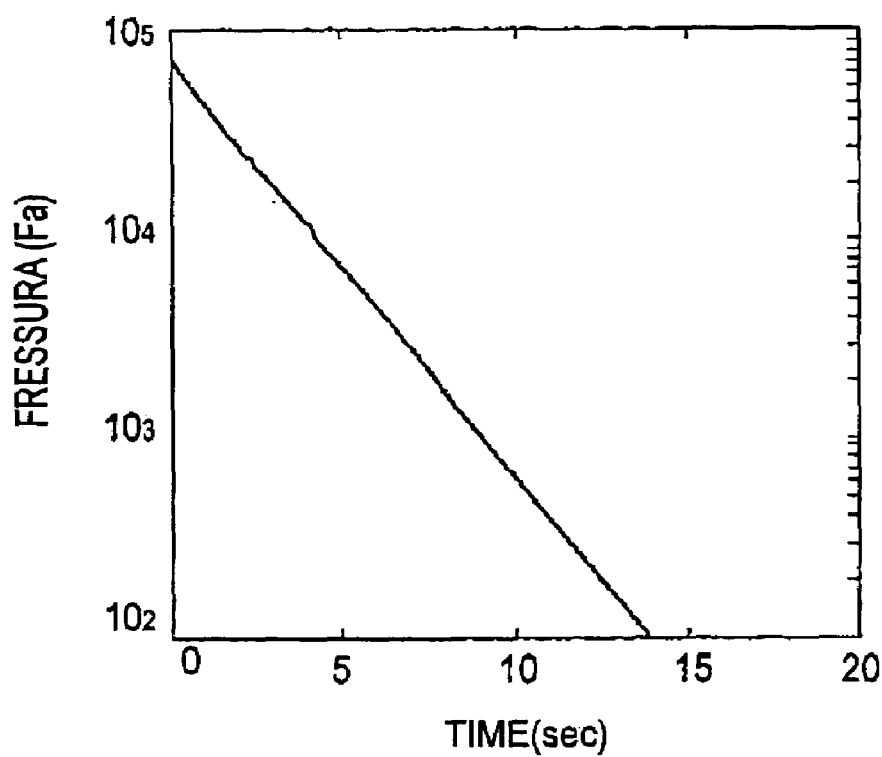
FIG. 10 is a graph for explaining the chamber inside pressure during vacuum evacuation in a third state, in the first embodiment of the present invention.
Figure 11:
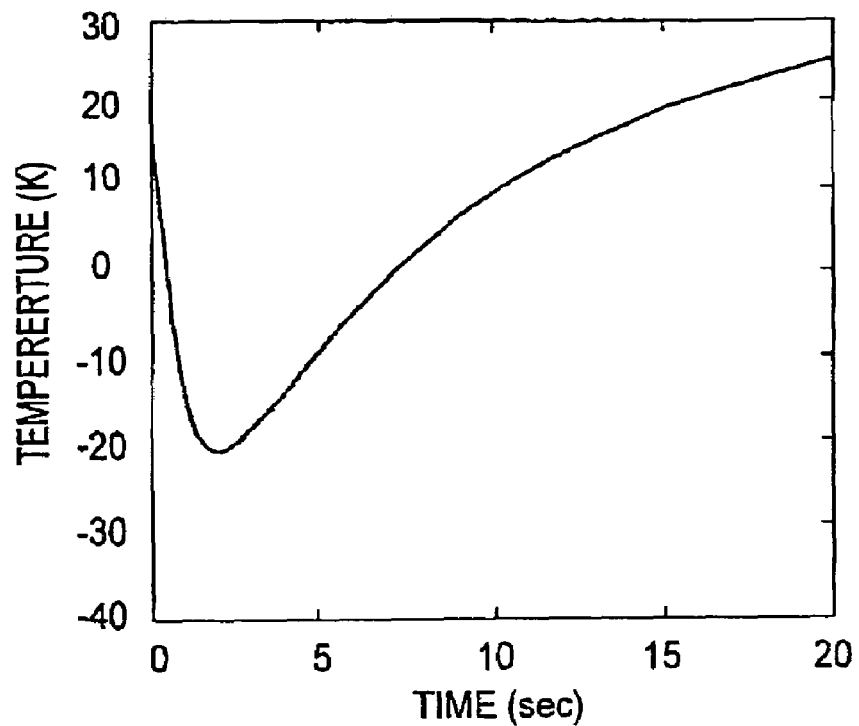
FIG. 11 is a graph for explaining the gas temperature during vacuum evacuation in the third state, in the first embodiment of the present invention.
Figure 12:
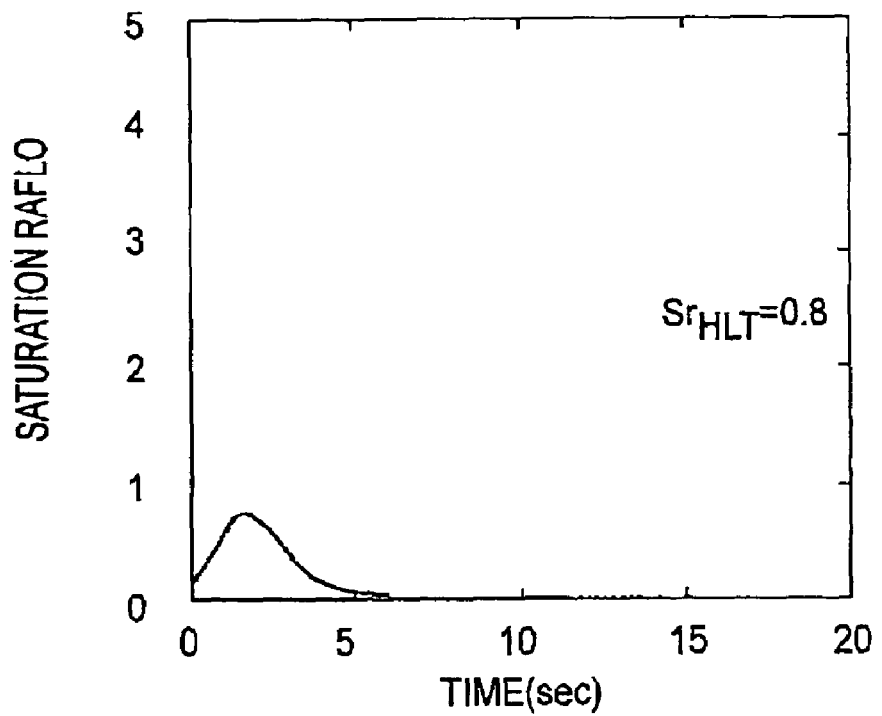
FIG. 12 is a graph for explaining the value Sr during vacuum evacuation in the third state, in the first embodiment of the present invention.

Specifically, simulations were made to the possibility of water vapor condensation while taking the gas temperature and the chamber temperature as parameters, with respect to a case wherein, in relation to a load-lock chamber having a capacity of a few liters and being arranged to process a 300 mm diameter wafer, vacuum evacuation was conducted by means of an idealistic exhaust system having an effective exhausting speed of 170 L/min, with the air having a relative humidity of 10% (23° C.). FIGS. 4, 7 and 10 illustrate the chamber inside pressure during the vacuum evacuation, and FIGS. 5, 8 and 11 illustrate the gas temperature. FIGS. 6, 9 and 12 show the results wherein the value Sr (hereinafter, "saturation degree") that can be defined by a saturated water vapor pressure $P_{sat}$ and the water vapor pressure $P_{vap}$ in accordance with the following equation, is plotted.

$$S_r = \frac{P_{vap}}{P_{sat}}$$

Normally, for a case wherein the saturation degree satisfies $Sr \geqq 1$, if there are particles inside the gas, the water vapor is condensed while using these particles as a nucleus (heterogeneous nucleation).

As will be apparent from these drawings, comparing the first and second states, it is seen that by raising the gas temperature by 10° C. before vacuum evacuation, as in the second state, the saturation degree Sr decreases from 1.4 to 1.2 as contrasted to the first state, wherein the temperature is not raised by 10° C. However, the saturation degree is still more than one, and this means that condensation of water vapor is inevitable. In this case, the saturation degree Sr can be reduced to less than one if the effective exhausting speed is lowered. However, the throughput will be lowered, on the other hand. Here, by raising the load-lock chamber temperature as well by 10° C. (third state), the saturation degree can be lowered to 0.8. Thus, the possibility of water vapor condensation is removed. This is because the wall of the load-lock chamber that has a large heat capacity as compared with the gas functions like a heat bath to the gas, and the amount of heat supply from the load-lock chamber wall to the gas during the vacuum exhausting is significantly large in the third state, as compared with the second state.

Thus, it is seen that, for the problem of water vapor condensation, raising the temperature of the load-lock chamber wall as well up to or beyond a predetermined temperature is more effective. While the above-described example shows that Sr can be reduced from 1.2 to 0.8 in accordance with the present invention, the effectiveness of the present invention will become more notable under more severe conditions, such as, for example, with a larger exhausting speed and a higher gas temperature and a higher chamber temperature.

Whether or not the water vapor is condensed in the chamber depends on chamber capacity, exhausting speed, relative humidity, gas temperature, chamber temperature, and so on. Therefore, it cannot be said that water vapor condensation can necessarily be avoided as long as the gas temperature and the chamber temperature at the initial stage of vacuum evacuation are raised up to or beyond a predetermined temperature. Practically, however, while specifying these parameters beforehand, simulations or experiments may be done. Through this procedure, the gas temperature and the chamber temperature can be set.

Thus, in the present invention, it is important to heat the load-lock chamber itself and, also, to keep the temperature thereof. This necessitates the use of measures for heat conduction from the load-lock chamber to the apparatus chamber (e.g., a chamber that covers the exposure apparatus as a whole, or an exposure chamber that accommodates therein an illumination optical system and a projection optical system). More specifically, since the load-lock chamber can be heated continuously up to a temperature higher than the apparatus reference temperature by about 10° C. or even by 20 to 30° C., in some cases, it is necessary to provide a structure for preventing thermal conduction of the heat to the apparatus side as much as possible or for avoiding external contact to any thermal factors even if the heat is conducted.

Figure 18:
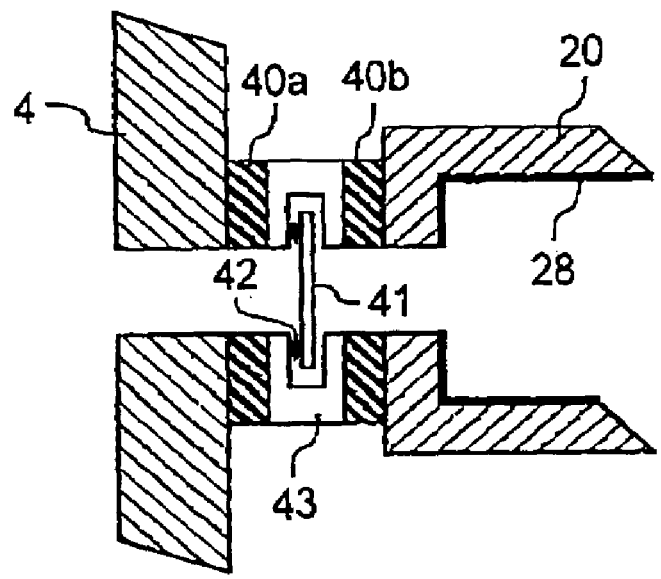
FIG. 18 is a schematic view of a first example of a heat insulating structure to be provided between a load-lock chamber and an apparatus chamber, in accordance with the present invention.
Figure 19:
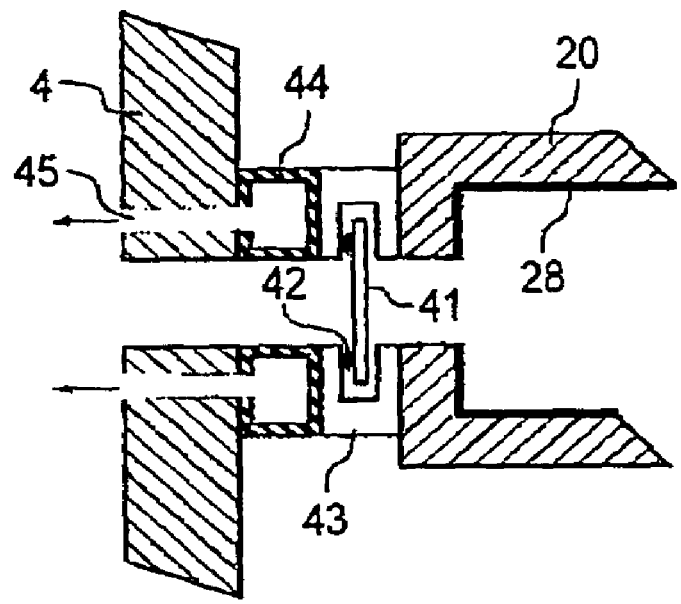
FIG. 19 is a schematic view of a second example of a heat insulating structure to be provided between a load-lock chamber and an apparatus chamber, in accordance with the present invention.

As a specific example, a heat insulating material may be inserted between the load-lock chamber and the apparatus chamber. Alternatively, a heat insulating structure may be provided. FIGS. 18 and 19 are fragmentary sectional views, respectively, wherein an apparatus chamber and a load-lock chamber are connected to each other through a gate valve. In FIG. 18, denoted at 4 is a portion of an apparatus chamber section, and denoted at 20 is a portion of a load-lock chamber section. Denoted at 28 is a flat heater as described hereinbefore. Denoted at 41, 42 and 43 are components that constitute a gate valve, wherein denoted at 41 is a partition plate, denoted at 42 is an O-ring, and denoted at 43 is a holding member for holding these elements. Driving means for actuating the partition wall is not illustrated. Denoted at 40a and 40b are heat insulating materials, which are important in the present invention. The heat insulating material 40a is provided between the apparatus and the gate valve, while the heat insulating material 40b is provided between the gate valve and the load-lock chamber. With the provision of dual heat insulating materials between the apparatus chamber and the load-lock chamber as described above, the flow of heat from the load-lock chamber wall 20 to the apparatus chamber wall 4 can be reduced considerably.

As an alternative, as shown in FIG. 19, a hollow member 44 may be disposed between the apparatus chamber 4 and the gate valve (41, 42, 43), while the inside of the hollow member is held at a vacuum, to provide a heat insulating structure. Denoted at 45 are vent holes extending through the hollow member 44 and the apparatus chamber wall 4, through which a vacuum is applied by means of a vacuum pump at the apparatus side. With the provision of a partial vacuum structure between the apparatus chamber and the load-lock chamber as described above, the flow of heat from the load-lock chamber wall 20 to the apparatus chamber wall 4 can be reduced considerably.

Figure 20:
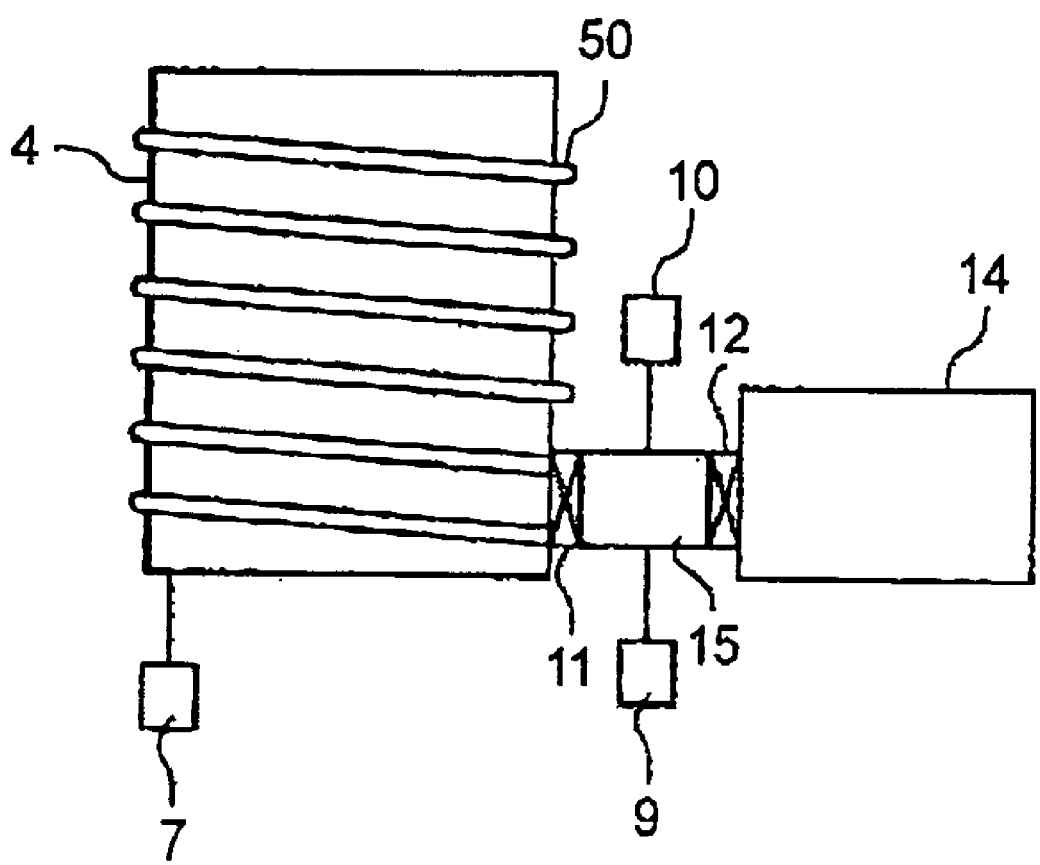
FIG. 20 is a schematic view of chamber heating means according to the present invention.

Preferably, in this embodiment, in addition to the insertion of a heat insulating material between the load-lock chamber and the apparatus chamber or to the provision of a heat insulating structure therebetween as described above, a temperature adjusting pipe 50 (FIG. 20) may be provided around the apparatus chamber to collect any heat of a small amount leaked to the apparatus chamber side. This is more effective to external disturbance caused by thermal factors to the exposure apparatus system. Here, while a temperature adjusting pipe is used as the temperature adjusting means for the apparatus chamber, in this example, the invention is not limited to this. Any other means may be used provided that it assures efficient temperature adjustment.

Furthermore, because there is a possibility of expansion and contraction of the load-lock chamber due to temperature variation, a bellows may preferably be used to connect the load-lock chamber with any other component, such as an exposure chamber, for example. This is preferably because it allows a shift of a relative positional relationship between the load-lock chamber and any other chamber, such as an exposure chamber (a chamber that accommodates therein an illumination optical system for illuminating a reticle having a pattern, with light from a light source, and/or a projection optical system for projecting the pattern onto a workpiece to be exposed, such as a wafer).

Figure 17:
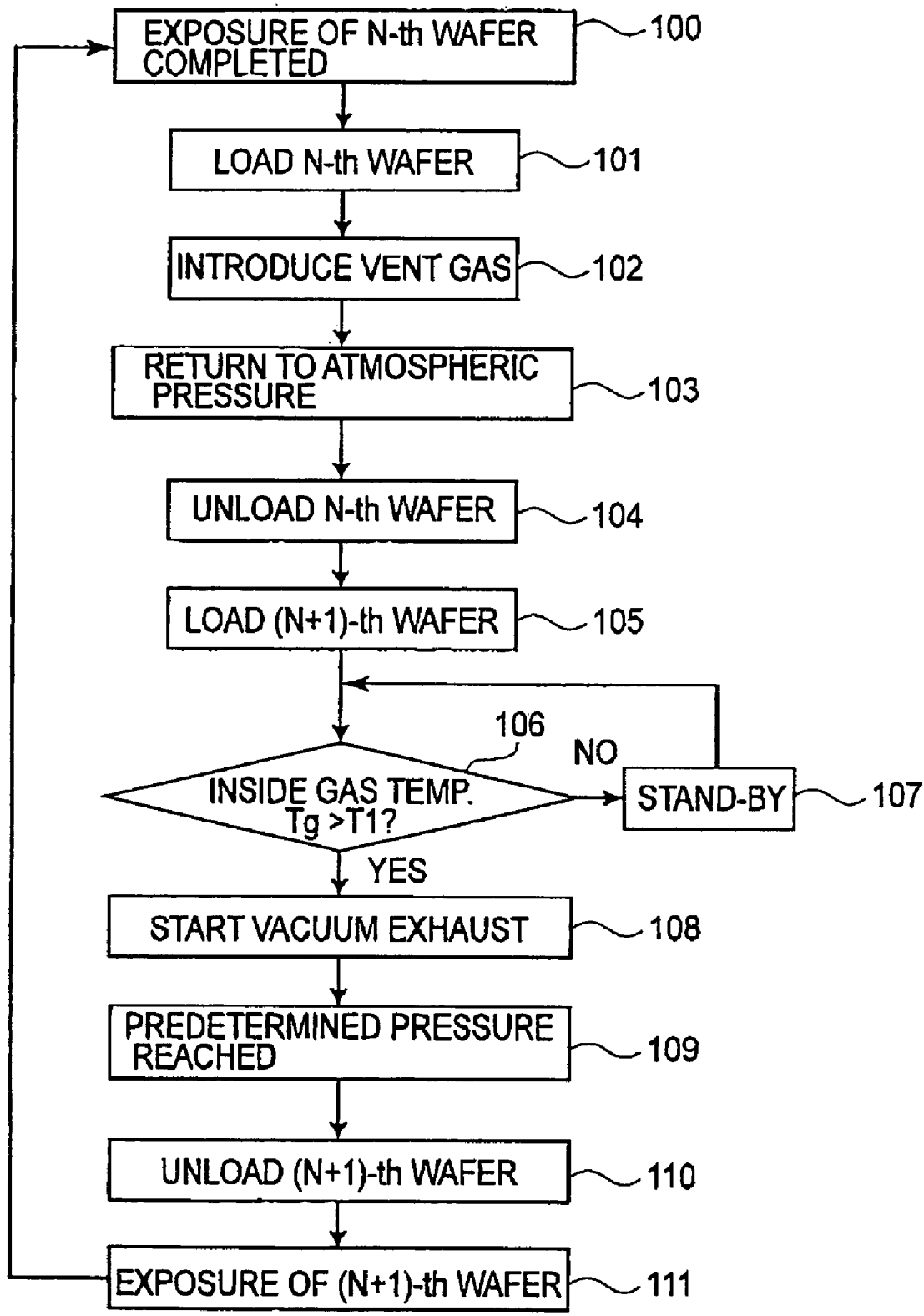
FIG. 17 is a flow chart for explaining an example of an operation to be performed in the first embodiment of the present invention.

Referring now to FIG. 17, the sequential operation of this embodiment will be described. By using the heater control circuit, the load-lock wall has been maintained at a predetermined temperature or more than it, as determined in the manner described hereinbefore. In this state, if the exposure of an N-th wafer is completed (step 100), the N-th wafer is loaded into the load-lock chamber (step 101). In order to bring the chamber inside pressure back to the atmospheric pressure, the apparatus side gate valve is closed, and then, a vent gas, such as dry $N_2$ or dry gas, for example, is introduced (step 102). Normally, the vent gas is at the same temperature as that of the gas supply system for the clean room, and the gas is introduced while being heated by the chamber wall, until the atmospheric pressure is reached (step 103). After the atmospheric pressure is resumed, the wafer exchanging chamber side gate valve is opened, and the N-th wafer is unloaded (step 104). Subsequently, an (N+1)th wafer is introduced (step 105), and the wafer exchanging chamber side gate valve is closed. During this wafer exchanging, water vapor may be mixed into the load-lock chamber. After introduction of the vent gas, the gas continuously receives heat supply from the chamber wall. Therefore, the inside gas temperature Tg gradually becomes close to the chamber wall temperature. If the gas temperature does not reach a predetermined temperature T1 (step 106), the system stands by in the state (step 107). After the predetermined temperature T1 is reached or exceeded, the valve control circuit opens the exhaust valve, whereby vacuum exhaust is initiated (step 108). After a predetermined pressure is reached (step 109), the (N+1)th wafer is unloaded out of the load-lock chamber (step 110), and the exposure process starts (step 111). Thereafter, the above-described procedure is repeated. This is an example of the operation according to the present invention.

In this embodiment, the heating means for heating the gas and the chamber has been described with reference to an example of a flat heater being put on the whole inside wall surface of the chamber as shown in FIG. 1. However, in the present invention, any other heating means may be used, provided that it can heat the gas and the chamber simultaneously and efficiently.

Figure 13:
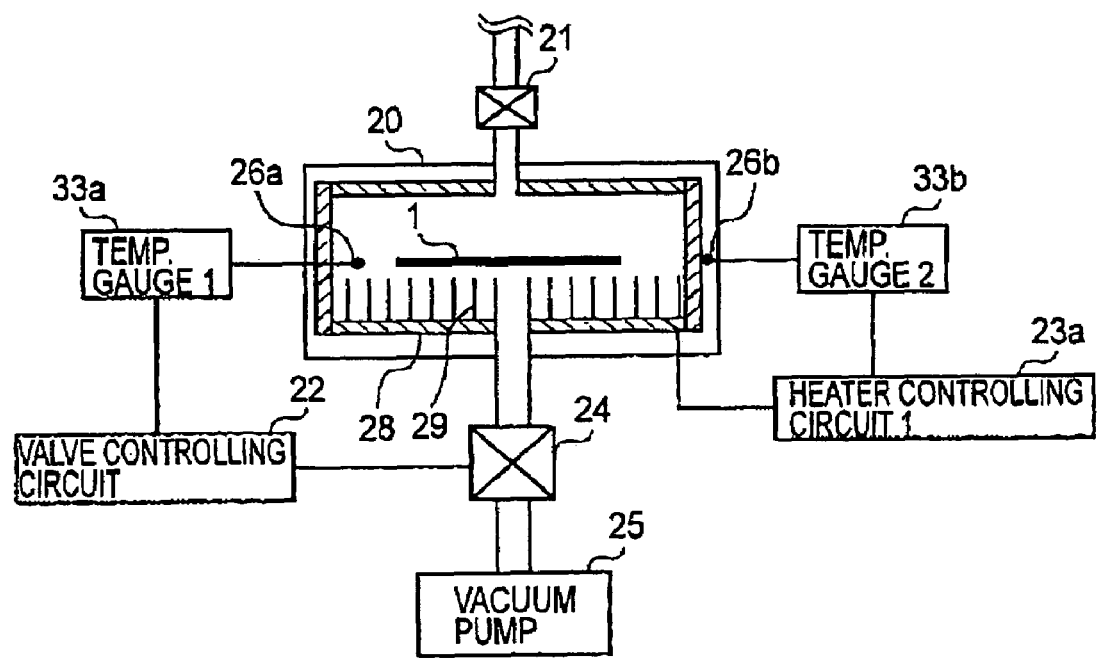
FIG. 13 is a schematic and diagrammatic view for explaining a first modified example according to the first embodiment of the present invention.
Figure 14:
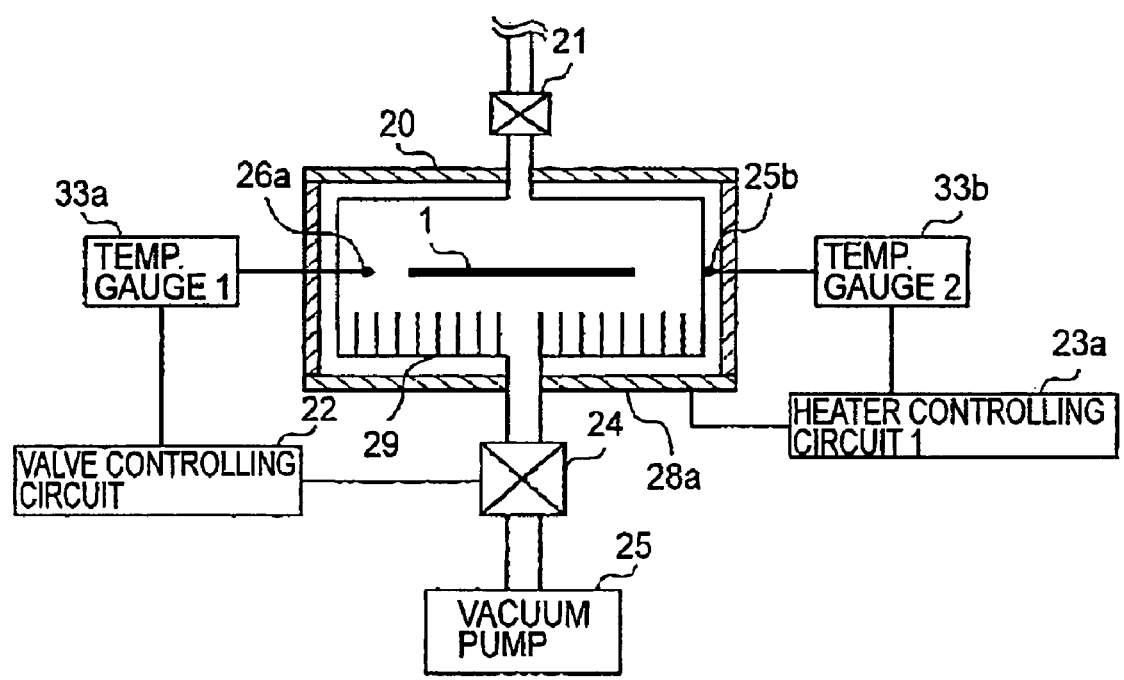
FIG. 14 is a schematic and diagrammatic view for explaining a second modified example according to the first embodiment of the present invention.

An example is shown in FIG. 13, wherein denoted at 29 are heat radiating fins attached to a flat heater mounted on the bottom of the chamber. This structure enables efficient heating of the inside gas. When this structure is embodied, the fin thickness and the fin height should desirably be optimized to assure efficient transfer of heat of the heater. Furthermore, when heating means, such as a flat heater, is provided inside the chamber, depending on the material used, it may cause a problem of degassing as a vacuum is applied. On that occasion, as shown in FIG. 14, heating means 28a, such as a flat heater, may be mounted at the outside of the chamber wall, while fins may be provided inside the chamber. As a further alternative, while not shown in the drawing, a temperature adjusting pipe may be provided inside the chamber or outside the chamber, and a liquid medium being temperature controlled at a predetermined temperature may be circulated through the pipe, thereby to heat the gas and the chamber.

Figure 15:
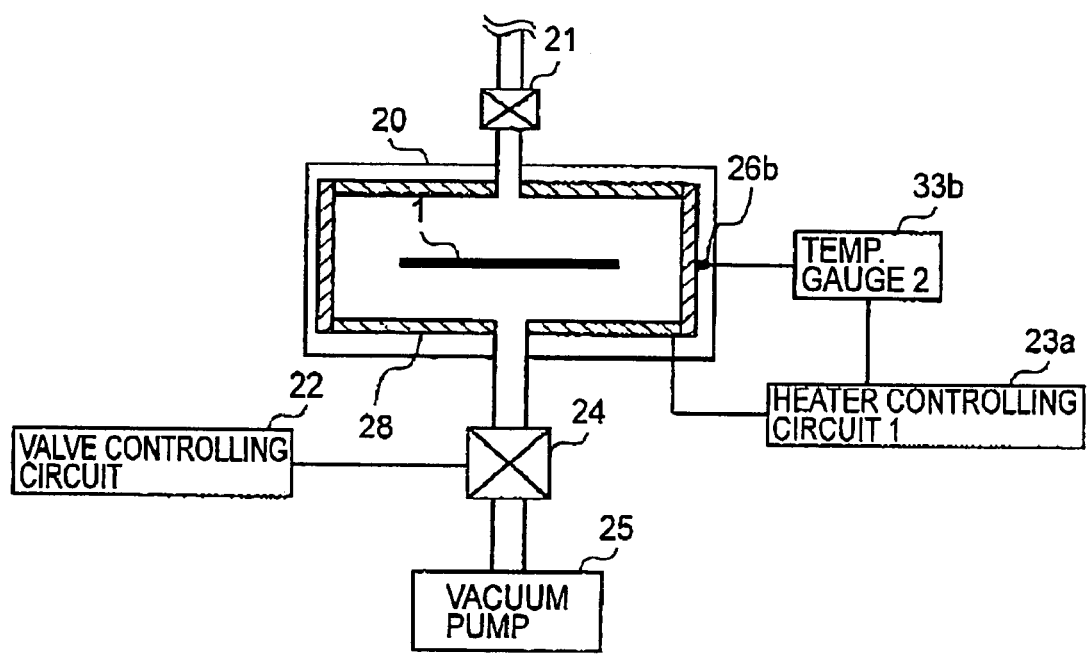
FIG. 15 is a schematic and diagrammatic view for explaining a third modified example according to the first embodiment of the present invention.

In this embodiment, the chamber temperature is raised beforehand up to a predetermined temperature or more, such that the vent gas supplied into the chamber receives heat supply from the chamber, and after the gas reaches a predetermined temperature, the vacuum evacuation is initiated. To this end, a temperature sensor is provided inside the chamber to measure the gas temperature. However, since, in this embodiment, the chamber is continuously maintained at or beyond the predetermined temperature, the time required for the gas temperature to reach a predetermined temperature would have relatively good reproducibility. On that occasion, by separately counting the time from the supply of the vent gas into the chamber and by conducting the heating for more than a predetermined time period, the predetermined temperature could be reached assuredly. Therefore, the necessity of measuring the gas temperature in real time may be avoided. Thus, on that occasion, the temperature sensor 26a and temperature gauge 33a may be omitted, as shown in FIG. 15. This makes the load-locking structure much simpler.

As described hereinbefore, the inside gas is heated beforehand prior to the vacuum exhaust, to lower the relative humidity. Additionally, by heating the chamber wall continuously up to a certain temperature, the amount of heat supply from the wall to the gas is enlarged. As a result, even if the gas temperature decreases during the vacuum exhaust, it is assured to prevent the water vapor contained in the gas from reaching the dew point, and creation of particles due to water vapor condensation can be avoided effectively. Here, the load-lock chamber wall should preferably be maintained at a temperature higher than the reference temperature (22 to 23° C.) of the exposure apparatus by 5 to 30° C., more preferably, by 10 to 20° C. Of course, the gas inside the load-lock chamber, as well, should desirably be kept similarly at a high temperature.

The heating mechanism for applying heat to the load-lock chamber may be provided on the outside wall of the load-lock chamber while taking into account the influence to a wafer, or the like, inside the load-lock chamber (i.e., to avoid dust creation from the heating mechanism or to avoid overheating of the wafer due to radiation or heat conclusion). Alternatively, it may preferably be provided in a portion being out of contact with the space surrounded by the load-lock chamber, that is, the space in which a wafer is accommodated.

Furthermore, for improvement of the throughput, the timing for loading a wafer into the load-lock chamber and the timing for heating the load-lock chamber may desirably be at least partially overlapped with each other. Specifically, it is preferable that, at the timing at which the loading of a wafer into the load-lock chamber starts, heating of the load-lock chamber has already been initiated. More preferably, during the wafer loading, the load-lock chamber is heated continuously.

Embodiment 2

A second embodiment of the present invention pays a specific note to the throughput. As an important feature, in relation to the supply of a vent gas into the chamber, a gas heating mechanism is provided separately from the load-lock chamber wall heating means, thereby to assure that a gas having a temperature raised beforehand up to a predetermined temperature is supplied into the chamber. This enables initiation of vacuum evacuation just after the wafer exchange.

Figure 16:
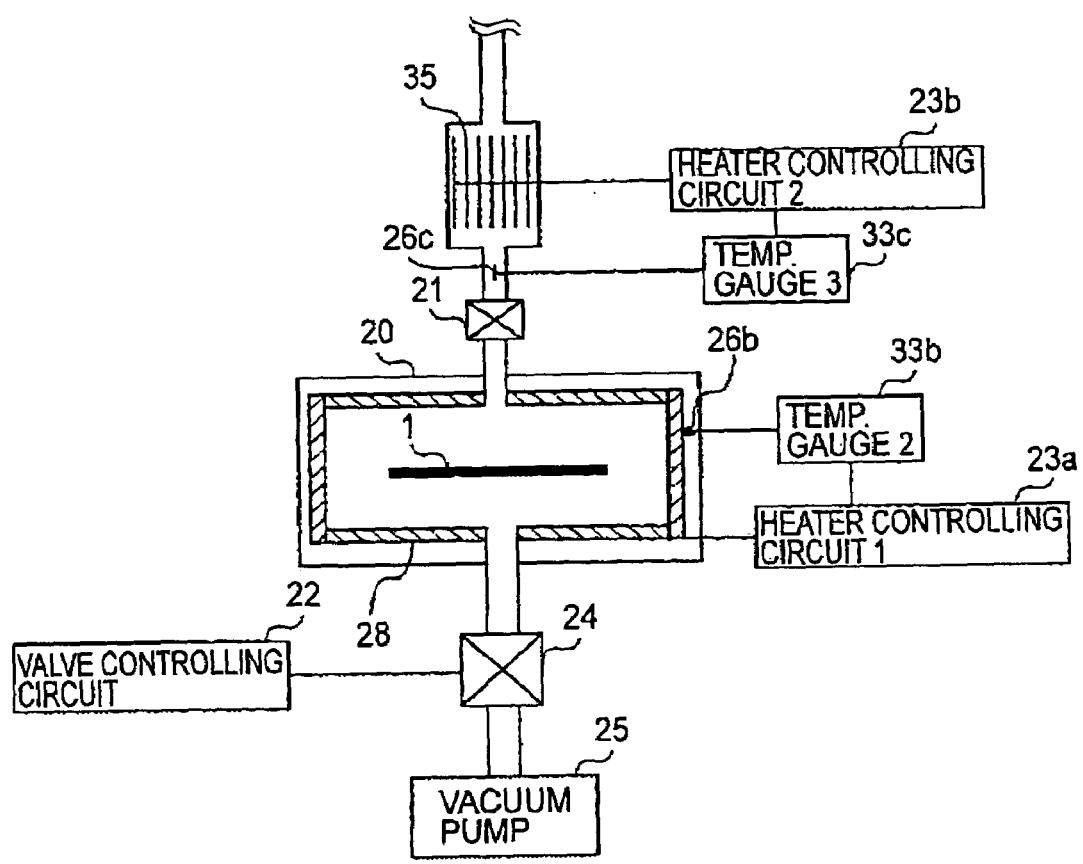
FIG. 16 is a schematic and diagrammatic view for explaining a second embodiment of the present invention.

Referring to FIG. 16, this embodiment will be described in detail. This embodiment differs from the first embodiment in that there is a heat exchanger 35 at an upstream position of a vent valve 21. The heat exchanger comprises a heater and a large number of fins connected thereto. Disposed downstream of this heat exchanger is a sensor 26c for measuring the gas temperature, the sensor being provided in a pipe. In association with a temperature gauge 3 (33c), the temperature of the heated gas can be measured. Denoted at 23b is a control circuit for adjusting the output of the heater of the heat exchanger 35, and it controls the heater so that the gas temperature at the time of gas venting is raised to and kept continuously at a predetermined temperature or higher than it. With the structure described above, it is assured that the temperature of gas supplied into the chamber for the venting has already been raised to a level equivalent to the chamber wall temperature. In this case, as has been described with reference to the operation of the first embodiment shown in FIG. 17, the operations at steps 106 and 107 can be omitted and, when the wafer is exchanged (steps 104 and 105), vacuum evacuation can be started immediately.

In this embodiment, the heat exchanger comprises a heater and a large number of fins. However, the invention is not limited to this, and any other structures may be used.

As described hereinbefore, a gas having been temperature-raised up to a predetermined temperature or beyond it is supplied into the chamber for gas venting, such that vacuum evacuation can be started just after the wafer exchange. Therefore, creation of particles due to water vapor condensation can be avoided while maintaining high throughput.

The first and second embodiments described above may combined appropriately, as long as no contradistinction is caused thereby.

Embodiment 3

Next, referring to FIGS. 21 and 22, an embodiment of a device manufacturing method, which uses an exposure apparatus described above, will be explained.

Figure 21:
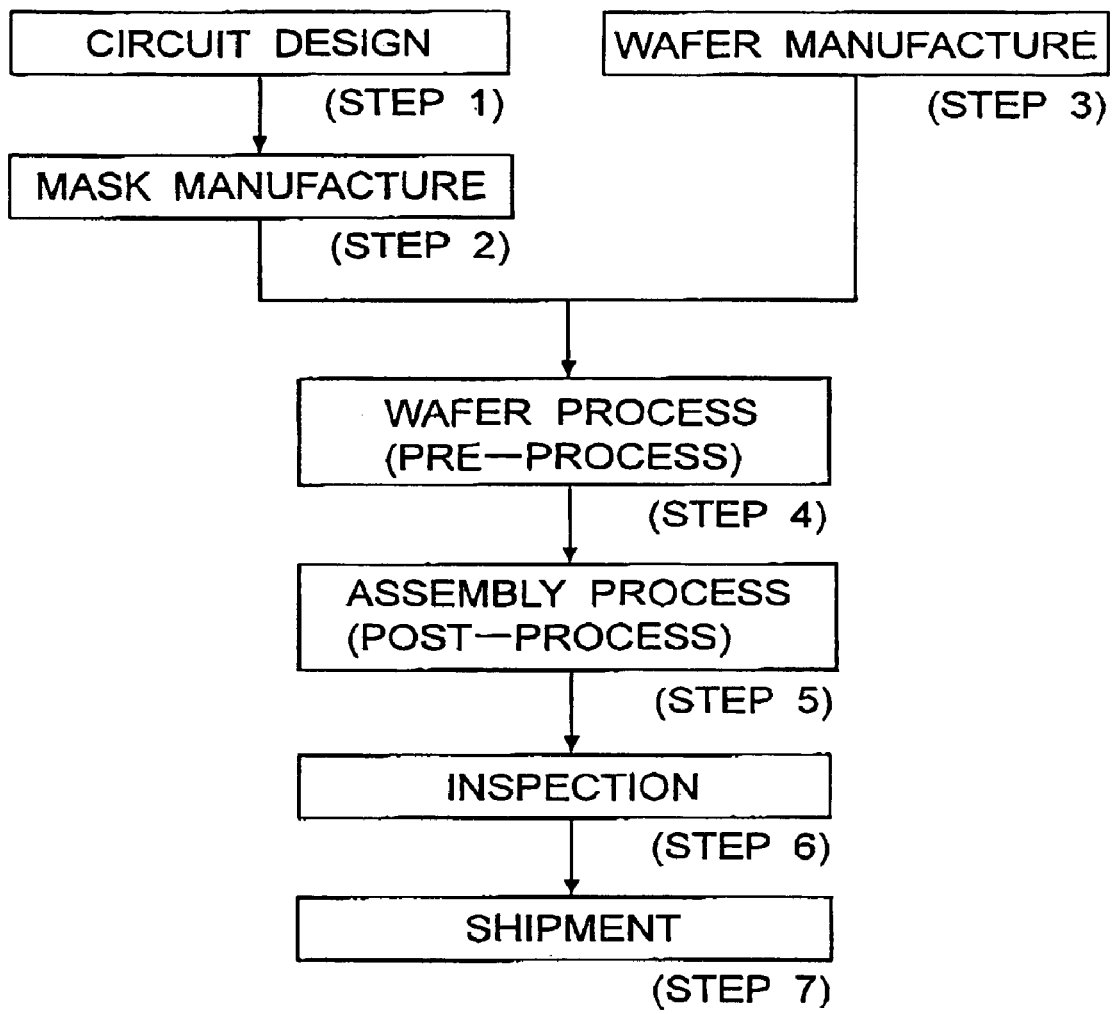
FIG. 21 is a flow chart for explaining the procedure of manufacturing devices, such as semiconductor chips (e.g., ICs or LSIs), LCDs and CCDs, for example, according to a third embodiment of the present invention.

FIG. 21 is a flow chart for explaining the procedure of manufacturing various microdevices, such as semiconductor chips (e.g., ICs or LSIs), liquid crystal panels, or CCDs, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process, which is called a pre-process, wherein, by using the thus prepared mask and wafer, a circuit is formed on the wafer in practice, in accordance with lithography. Step 5, subsequent to this, is an assembling step, which is called a post-process, wherein the wafer having been processed at step 5 is formed into semiconductor chips. This step includes an assembling (dicing and bonding) process and a packaging (chip sealing) process. Step 6 is an inspection step, wherein an operation check, a durability check, and so on, for the semiconductor devices produced by step 5, are carried out. With these processes, semiconductor devices are produced, and they are shipped (step 7).

Figure 22:
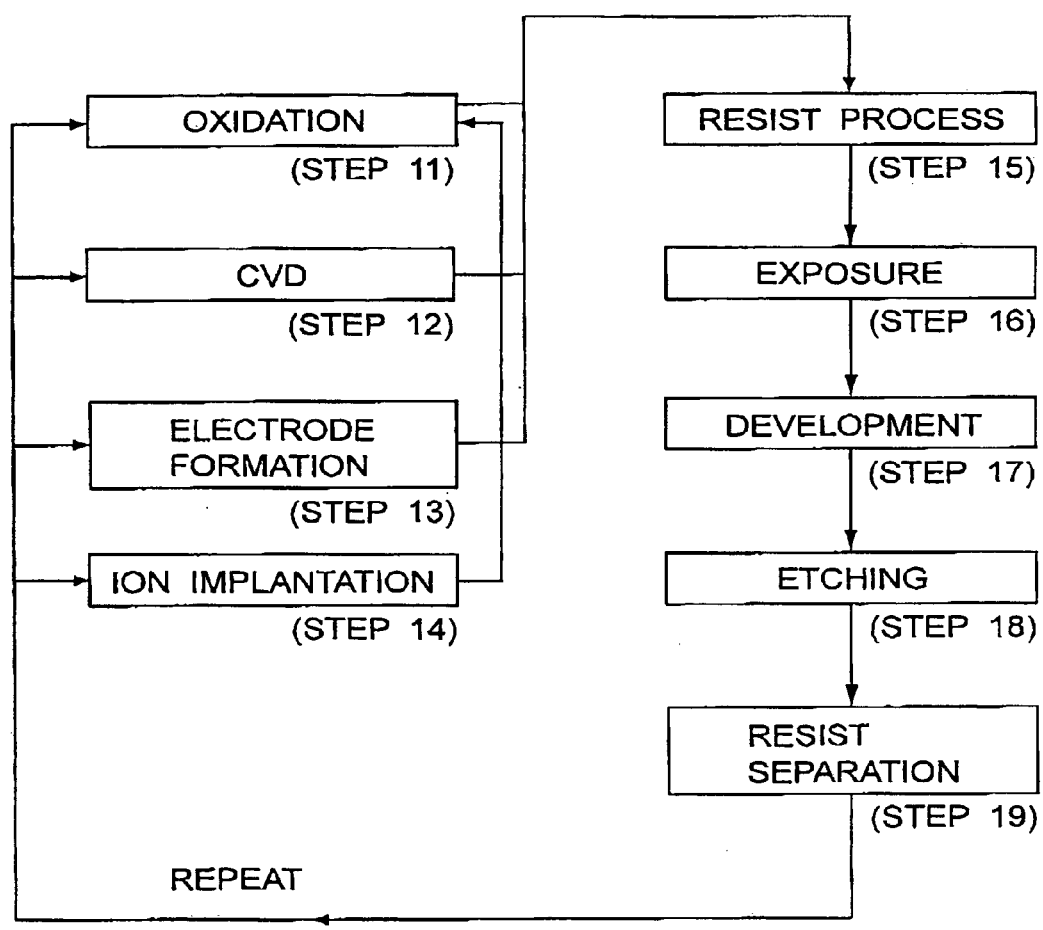
FIG. 22 is a flow chart for explaining details of a wafer process at step 4 shown in FIG. 21.

FIG. 22 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions onto the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density and high quality microdevices can be manufactured. As described above, a device manufacturing method that uses an exposure apparatus as well as a device as a product thereof are included in the scope of the present invention.

In accordance with the embodiments of the present invention as described hereinbefore, the inside gas is heated beforehand, prior to vacuum evacuation, by which the relative humidity is lowered. Additionally, the chamber wall is heated continuously to a predetermined temperature, thereby to enlarge the amount of heat supplied from the wall to the gas during the vacuum evacuation. This assures that, even if the gas temperature is lowered, the water vapor contained in the gas is prevented from reaching the dew point, such that creation of particles due to the water vapor condensation can be prevented effectively. Furthermore, by heating the chamber wall continuously to a predetermined temperature, it is assured that the inside gas is heated beforehand prior to the vacuum exhaust. Thus, even if the gas temperature is lowered during the vacuum evacuation, the water vapor contained in the gas is prevented from reaching the dew point. Therefore, creation of particles due to the water vapor condensation can be prevented effectively. Moreover, on the basis of experiments or simulations, the initial gas temperature can be set at a temperature with which condensation of water vapor does not occur. This assuredly prevents water vapor condensation during the vacuum exhaust. The load-lock chamber is provided with heating means to maintain the chamber temperature constant. This enables an enlarged amount of heat supply from the load-lock chamber to the inside gas during vacuum evacuation.

The gas temperature may be measured and, when a predetermined temperature or higher is measured, the vacuum exhausting may be initiated. This avoids a time lag, and it is advantageous with respect to the throughput. When the heating time for the gas inside the load-lock chamber is counted, the gas temperature measuring means may be omitted. This makes the structure much simpler. Heat insulating means may be provided between the apparatus chamber and the load-lock, to insulate heat conduction therebetween. This effectively reduces the amount of heat supply to the apparatus chamber, from the load-lock chamber being heated. As a result, thermal external disturbance to the apparatus can be reduced to be close to zero.

During the gas venting, a gas having been temperature-raised up to a predetermined temperature or more may be supplied into the chamber. This enables a start of vacuum evacuation just after the wafer exchange. Thus, creation of particles due to water vapor condensation can be avoided, while maintaining high throughput. Moreover, on the basis of experiments or simulations, the initial gas temperature and the chamber wall temperature before vacuum evacuation can be set at a temperature with which condensation of water vapor does not occur. This assuredly prevents water vapor condensation during the vacuum exhaust. The load-lock chamber may be provided with heating means to maintain the chamber temperature constant. This enables an enlarged amount of heat supply from the load-lock chamber to the inside gas. Furthermore, since, during the gas venting, a gas having been temperature-raised up to a predetermined temperature or higher can be supplied into the chamber, the gas heating time can be shortened and, thus, high throughput is enabled. When heat insulating means is provided between the apparatus chamber and the load-lock chamber to isolate the heat transfer therebetween, the amount of heat supplied to the apparatus chamber from the load-lock chamber generating heat can be reduced. As a result, thermal external disturbance to the apparatus can be reduced to be close to zero.

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 2003-434539, filed Dec. 26, 2003, which is hereby incorporated by reference.

What is claimed is:

1. An exposure apparatus for exposing a substrate, said apparatus comprising:
    an optical system being set at a reference temperature, for directing light to the substrate;
    an exposure chamber for storing the optical system in a vacuum ambience; and
    a load-lock chamber, disposed adjacent to said exposure chamber, for converting an ambience of a space surrounding the substrate into a vacuum ambience,
    wherein, when said load-lock chamber converts the ambience of the space surrounding the substrate into a vacuum ambience, the temperature of said load-lock chamber is made higher than the reference temperature.

2. An apparatus according to claim 1, wherein the difference between the load-lock chamber temperature and the reference temperature is not less than five degrees and not greater than thirty degrees.

3. An apparatus according to claim 1, wherein the difference between the load-lock chamber temperature and the reference temperature is not less than ten degrees.

4. An apparatus according to claim 1, wherein the difference between the load-lock chamber temperature and the reference temperature is not greater than twenty degrees.

5. An apparatus according to claim 1, further comprising a heating mechanism for applying heat to said load-lock chamber, wherein said heating mechanism is provided in a space, inside said load-lock chamber, that does not contact the space surrounding the substrate.

6. An apparatus according to claim 1, wherein the temperature of said load-lock chamber is a temperature with which water vapor inside the space surrounding the substrate is not condensed during exhausting of a gas inside the space surrounding the substrate.

7. An apparatus according to claim 1, wherein said load-lock chamber starts conversion of the ambience of the space surrounding the substrate inside said load-lock chamber either when a result of measurement of gas temperature measuring means provided in relation to said load-lock chamber shows a temperature equal to or higher than a predetermined temperature or when the time in which a gas inside said load-lock chamber receives heat supply from a wall of said load-lock chamber becomes equal to or longer than a predetermined time period.

8. An apparatus according to claim 1, further comprising at least one of a heat insulating material or a heat insulating structure provided between said load-lock chamber and said exposure chamber.

9. An apparatus according to claim 1, further comprising gas supply means for supplying a gas into said load-lock chamber, and gas temperature adjusting means capable of raising the temperature of the gas supplied by said gas supplying means up to or beyond a predetermined temperature.

10. An apparatus according to claim 1, further comprising temperature measuring means for measuring the temperature of said load-lock chamber, and control means for controlling the temperature of said load-lock chamber on the basis of the measured temperature of said load-lock chamber.

11. An apparatus according to claim 1, further comprising heating means for applying heat to said load-lock chamber.

12. An apparatus according to claim 1, further comprising a deformable member provided between said exposure chamber and said load-lock chamber for relative displacement.

13. An apparatus according to claim 12, wherein said deformable member is a bellows.

14. A device manufacturing method comprising the steps of:
    exposing a substrate by use of an exposure apparatus as recited in claim 1; and
    developing the exposed substrate.

* * * * *

UNITED STATES PATENT AND TRADEMARK OFFICE
CERTIFICATE OF CORRECTION

PATENT NO. : 7,193,682 B2
APPLICATION NO. : 11/019112
DATED : March 20, 2007
INVENTOR(S) : Masami Yonekawa It is certified that error appears in the above-identified patent and that said Letters Patent is hereby corrected as shown below:

ON THE TITLE PAGE:
    In item "(56) References Cited," under "FOREIGN PATENT DOCUMENTS," the second-listed document, "JP    2003229348    *    8/2003" should read -- JP    2003-229348    *    8/2003 --.

IN THE DRAWINGS:
    In "FIG. 4," "Sheet 3 of 16," "FRESSUREA(Fa)" should read -- PRESSURE(Fa) --.
    In "FIG. 6," "Sheet 4 of 16," "SATURATION RAFLO" should read -- SATURATION RATIO --.
    In "FIG. 7," "Sheet 5 of 16," "FRESSUREA(Fa)" should read -- PRESSURE(Fa) --.
    In "FIG. 9," "Sheet 6 of 16," "SATURATION RAFLO" should read -- SATURATION RATIO --.
    In "FIG. 10," "Sheet 6 of 16," "FRESSUREA(Fa)" should read -- PRESSURE(Fa) --.
    In "FIG. 11," "Sheet 7 of 16," "TEMPERERTURE (K)" should read -- TEMPERATURE (K) --.
    In "FIG. 12," "Sheet 7 of 16," "SATURATION RAFLO" should read -- SATURATION RATIO --.

COLUMN 1:
    Line 14, "lin-" should read -- line- --.
    Line 15, "ewidth" should read -- width -- and "0.11 μm" should read -- 0.1 μm --.

COLUMN 4:
    Line 62, "san" should read -- scan --.

COLUMN 5:
    Line 43, "locking," should read -- lock chamber, --.
    Line 46, "is" should read -- as --.
    Line 61, "reach dew point" should read -- reaches the dewpoint --.

COLUMN 11:
    Line 35, "may" should read -- may be --.

UNITED STATES PATENT AND TRADEMARK OFFICE
CERTIFICATE OF CORRECTION

PATENT NO. : 7,193,682 B2
APPLICATION NO. : 11/019112
DATED : March 20, 2007
INVENTOR(S) : Masami Yonekawa It is certified that error appears in the above-identified patent and that said Letters Patent is hereby corrected as shown below:

COLUMN 12:
      Line 55, "load-lock," should read -- load-lock chamber, --.

Signed and Sealed this

Twenty-sixth Day of August, 2008

JON W. DUDAS
*Director of the United States Patent and Trademark Office*